United States Patent
Lee

(10) Patent No.: US 10,608,030 B2
(45) Date of Patent: *Mar. 31, 2020

(54) IMAGE SENSORS WITH DIFFRACTIVE LENSES

(71) Applicant: SEMICONDUCTOR COMPONENTS INDUSTRIES, LLC, Phoenix, AZ (US)

(72) Inventor: Byounghee Lee, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/361,543

(22) Filed: Mar. 22, 2019

(65) Prior Publication Data

US 2019/0221598 A1 Jul. 18, 2019

Related U.S. Application Data

(63) Continuation of application No. 15/719,174, filed on Sep. 28, 2017, now Pat. No. 10,283,543.

(51) Int. Cl.
| | |
|---|---|
| *H01L 27/146* | (2006.01) |
| *G02B 13/00* | (2006.01) |
| *G02B 3/00* | (2006.01) |
| *G02B 27/42* | (2006.01) |
| *G02B 5/18* | (2006.01) |
| *G02B 5/20* | (2006.01) |

(52) U.S. Cl.
CPC ...... *H01L 27/14625* (2013.01); *G02B 3/0056* (2013.01); *G02B 5/1885* (2013.01); *G02B 5/201* (2013.01); *G02B 13/0085* (2013.01); *G02B 27/4205* (2013.01); *H01L 27/1462* (2013.01); *H01L 27/1463* (2013.01); *H01L 27/14603* (2013.01); *H01L 27/14621* (2013.01); *H01L 27/14627* (2013.01)

(58) Field of Classification Search
CPC .......... H01L 27/14625; H01L 27/1463; H01L 27/14621; G02B 5/1885; G02B 3/0056
See application file for complete search history.

(56) References Cited

U.S. PATENT DOCUMENTS

| | | |
|---|---|---|
| 4,878,735 A | 11/1989 | Vilums |
| 5,734,155 A | 3/1998 | Rostoker |
| 9,099,580 B2 | 8/2015 | Hirigoyen et al. |

(Continued)

*Primary Examiner* — Julia Slutsker
(74) *Attorney, Agent, or Firm* — Treyz Law Group, P.C.; Joseph F. Guihan

(57) ABSTRACT

An image sensor may include an array of imaging pixels. Each imaging pixel may have a photosensitive area that is covered by a respective diffractive lens to focus light onto the photosensitive area. The diffractive lenses may have a higher index of refraction than the surrounding materials. The diffractive lenses may be formed on an upper or lower surface of a planarization layer or may be embedded within the planarization layer. In some cases, multiple diffractive lenses may be formed over the imaging pixels. Some of the multiple diffractive lenses may have refractive indexes lower than the planarization layer such that the diffractive lenses defocus light. Focusing and defocusing diffractive lenses may be used to tune the response of the imaging pixels to incident light.

19 Claims, 11 Drawing Sheets

(56) References Cited

U.S. PATENT DOCUMENTS

| | | |
|---|---|---|
| 2005/0110104 A1 | 5/2005 | Boettiger et al. |
| 2005/0242271 A1 | 11/2005 | Weng et al. |
| 2006/0145056 A1* | 7/2006 | Jung .................. H01L 27/14625 250/208.1 |
| 2006/0177959 A1 | 8/2006 | Boettiger |
| 2006/0292735 A1 | 12/2006 | Boettiger et al. |
| 2007/0001252 A1 | 1/2007 | Noda et al. |
| 2007/0127125 A1 | 6/2007 | Sasaki |
| 2007/0278604 A1* | 12/2007 | Minixhofer .......... G02B 5/1809 257/432 |
| 2009/0090937 A1 | 4/2009 | Park |
| 2009/0127440 A1 | 5/2009 | Nakai |
| 2009/0160965 A1 | 6/2009 | Sorek et al. |
| 2009/0242736 A1 | 10/2009 | Rennie |
| 2009/0250594 A1* | 10/2009 | Tanaka .................. G02B 5/201 250/208.1 |
| 2010/0091168 A1 | 4/2010 | Igarashi |
| 2011/0096210 A1* | 4/2011 | Koshino ........... H01L 27/14627 348/273 |
| 2011/0234830 A1 | 9/2011 | Kiyota et al. |
| 2013/0015545 A1 | 1/2013 | Toumiya et al. |
| 2013/0240962 A1 | 9/2013 | Wang et al. |
| 2014/0091205 A1 | 4/2014 | Takamiya |
| 2014/0197301 A1 | 7/2014 | Velichko et al. |
| 2014/0313379 A1 | 10/2014 | Mackey |
| 2015/0003777 A1 | 1/2015 | Tseng et al. |
| 2015/0109501 A1 | 4/2015 | Sekine |
| 2016/0111461 A1 | 4/2016 | Ahn et al. |
| 2016/0112614 A1 | 4/2016 | Masuda et al. |
| 2016/0211306 A1 | 7/2016 | Choi et al. |
| 2016/0351610 A1 | 12/2016 | Chen |
| 2016/0377871 A1 | 12/2016 | Kress et al. |
| 2017/0133420 A1 | 5/2017 | Silsby |
| 2017/0141145 A1 | 5/2017 | Yamashita et al. |
| 2017/0176787 A1 | 6/2017 | Jia et al. |
| 2018/0026065 A1 | 1/2018 | Hsieh et al. |
| 2018/0145103 A1 | 5/2018 | Hirigoyen |

* cited by examiner

IMAGE SENSORS WITH DIFFRACTIVE LENSES

This application is a continuation of U.S. patent application Ser. No. 15/719,174, filed Sep. 28, 2017, which is hereby incorporated by reference herein in its entirety. This application claims the benefit of and claims priority to U.S. patent application Ser. No. 15/719,174, filed Sep. 28, 2017.

BACKGROUND

This relates generally to image sensors and, more particularly, to image sensors having lenses to focus light.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Each pixel receives incident photons (light) and converts the photons into electrical signals. Column circuitry is coupled to each pixel column for reading out pixel signals from the image pixels. Image sensors are sometimes designed to provide images to electronic devices using a Joint Photographic Experts Group (JPEG) format.

Conventional image sensors sometimes include a color filter element and a microlens above each pixel. The microlenses of conventional image sensors typically have curved surfaces and use refraction to focus light on an underlying photodiode. However, these types of microlenses may allow peripheral light to pass through the microlenses without being focused, leading to optical cross-talk.

It would therefore be desirable to provide improved lenses for image sensors.

DETAILED DESCRIPTION

Figure 1:
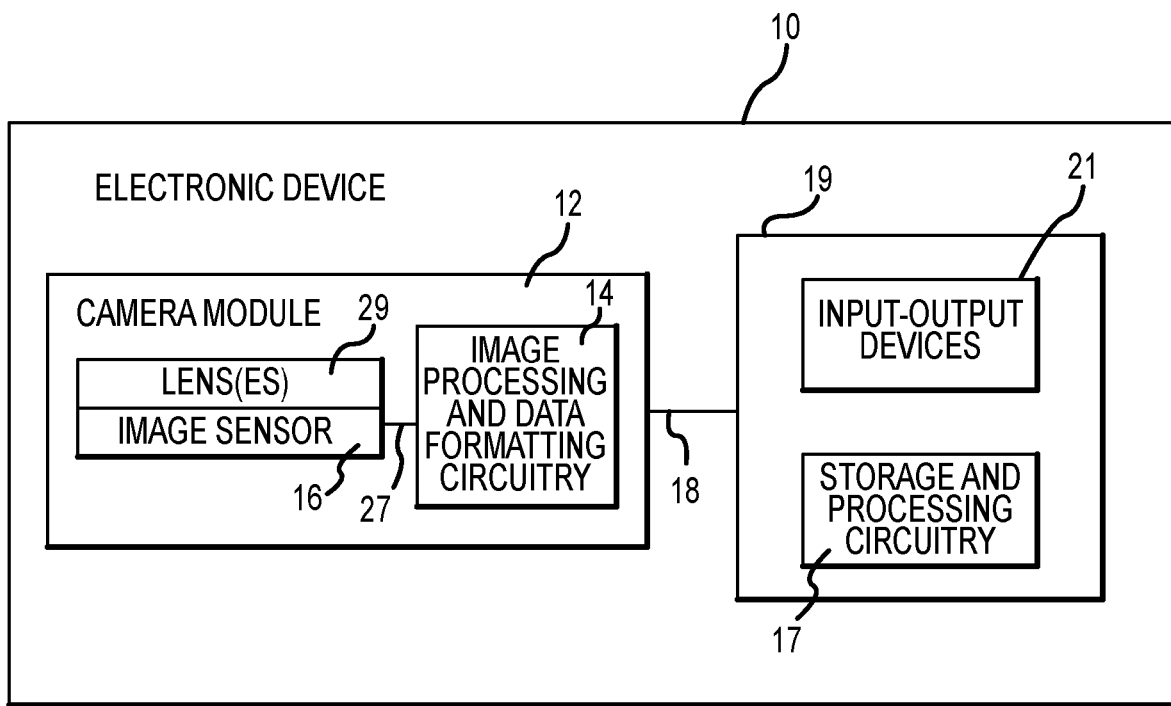
FIG. 1 is a schematic diagram of an illustrative electronic device that may include an image sensor in accordance with an embodiment.

Embodiments of the present invention relate to image sensors with pixels that include diffractive lenses. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc. For example, during automatic focusing operations, image processing and data formatting circuitry 14 may process data gathered by phase detection pixels in image sensor 16 to determine the magnitude and direction of lens movement (e.g., movement of lens 29) needed to bring an object of interest into focus.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked.

Camera module 12 may convey acquired image data to host subsystems 19 over path 18 (e.g., image processing and data formatting circuitry 14 may convey image data to subsystems 19). Electronic device 10 typically provides a user with numerous high-level functions. In a computer or advanced cellular telephone, for example, a user may be provided with the ability to run user applications. To implement these functions, host subsystem 19 of electronic device 10 may include storage and processing circuitry 17 and input-output devices 21 such as keypads, input-output ports, joysticks, and displays. Storage and processing circuitry 17 may include volatile and nonvolatile memory (e.g., random-access memory, flash memory, hard drives, solid state drives, etc.). Storage and processing circuitry 17 may also include microprocessors, microcontrollers, digital signal processors, application specific integrated circuits, or other processing circuits.

Figure 2:
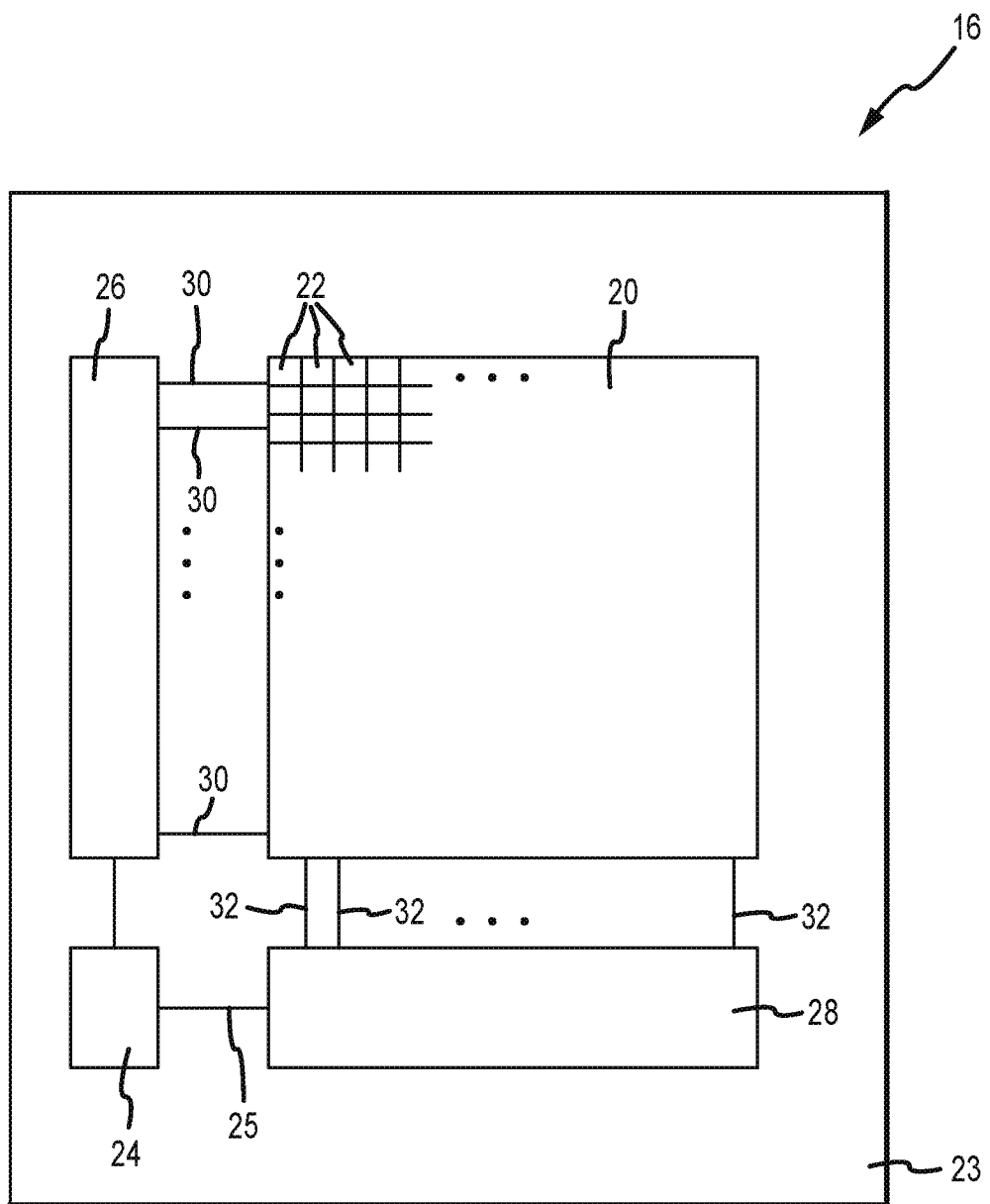
FIG. 2 is a diagram of an illustrative pixel array and associated readout circuitry for reading out image signals from the pixel array in accordance with an embodiment.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through wire bonding or flip-chip bonding.

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 over path 25 for pixels in one or more pixel columns.

Figure 3A:
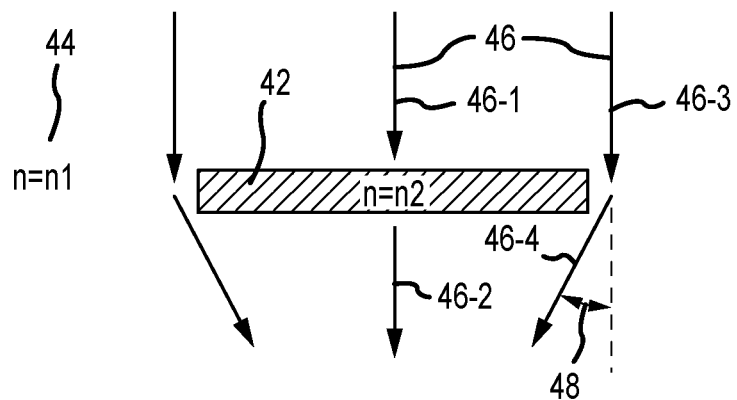
FIG. 3A is a cross-sectional side view of an illustrative focusing diffractive lens with a greater index of refraction than the surrounding medium in accordance with an embodiment.
Figure 3B:
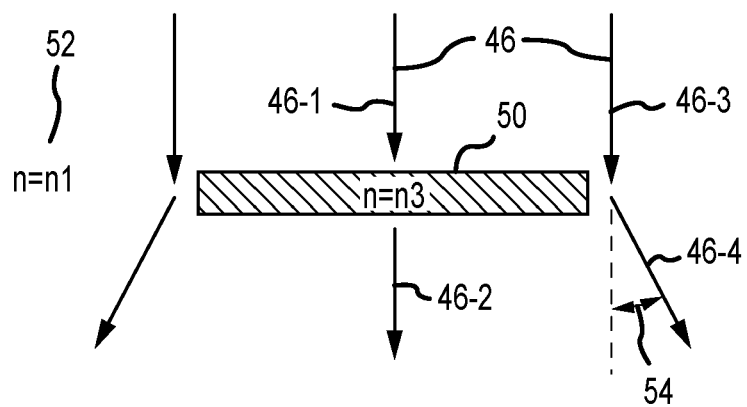
FIG. 3B is a cross-sectional side view of an illustrative defocusing diffractive lens with a lower index of refraction than the surrounding medium in accordance with an embodiment.

FIGS. 3A and 3B are cross-sectional side views of illustrative diffractive lenses that may be used in image sensors. As shown in FIG. 3A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 3A, the index of refraction of the lens may be greater than the index of refraction of the surrounding material (i.e., n2>n1). This results in incident light being focused towards a focal point. In this arrangement, diffractive lens 42 acts as a convex lens.

Lens 42 may be transparent to incident light. Therefore, some light may pass through the lens without being focused. For example, incident light 46-1 may pass through the center of diffractive lens 42. The corresponding light 46-2 on the other side of the diffractive lens may travel in the same direction as incident light 46-1. In contrast, incident light at the edge of diffractive lens 42 may be redirected due to diffraction. For example, incident light 46-3 may pass by the edge of diffractive lens 42. The light may be redirected such that the output light 46-4 travels at an angle 48 relative to the incident light 46-3. In other words, the diffractive lens redirects the light at the edge of the lens using diffraction.

Diffraction occurs when a wave (such as light) encounters an obstacle. When light passes around the edge of an object, it will be bent or redirected such that the direction of the original incident light changes. The amount and direction of bending depends on numerous factors. In an imaging sensor, diffraction of light can be used (with diffractive lenses) to redirect incident light in desired ways (i.e., focusing incident light on photodiodes to mitigate optical cross-talk).

In the example of FIG. 3A, diffractive lens 42 has an index of refraction greater than the index of refraction of the surrounding medium 44. This causes incident light to be focused towards a focal point. However, this example is merely illustrative and other embodiments may be used.

As shown in FIG. 3B, a diffractive lens 50 may be formed in a surrounding medium 52. The surrounding material 52 may be formed from a first material that has a first index of refraction (n1). Diffractive lens 50 may be formed from a third material that has a third index of refraction (n3). In the example of FIG. 3B, the index of refraction of the lens may be less than the index of refraction of the surrounding material (i.e., n1>n3). This results in incident light 46 being defocused. In this arrangement, diffractive lens 50 acts as a concave lens.

Lens 50 may be transparent to incident light. Therefore, some light may pass through the lens without being focused. For example, incident light 46-1 may pass through the center of diffractive lens 50. The corresponding light 46-2 on the other side of the diffractive lens may travel in the same direction as incident light 46-1. In contrast, incident light at the edge of diffractive lens 50 may be redirected due to diffraction. For example, incident light 46-3 may pass by the edge of diffractive lens 50. The light may be redirected such that the output light 46-4 travels at an angle 54 relative to the incident light 46-3. In other words, the diffractive lens redirects the light at the edge of the lens using diffraction.

Figure 4A:
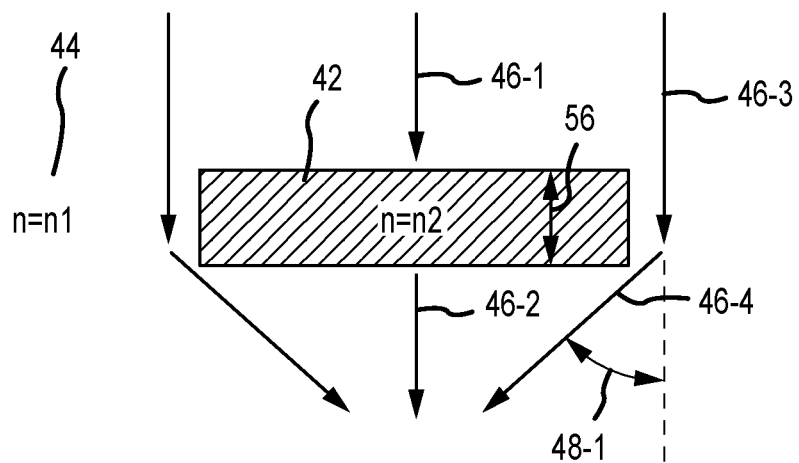
FIGS. 4A and 4B are cross-sectional side views of illustrative diffractive lenses showing how the thickness of the diffractive lens may be adjusted to change the response to incident light in accordance with an embodiment.
Figure 4B:
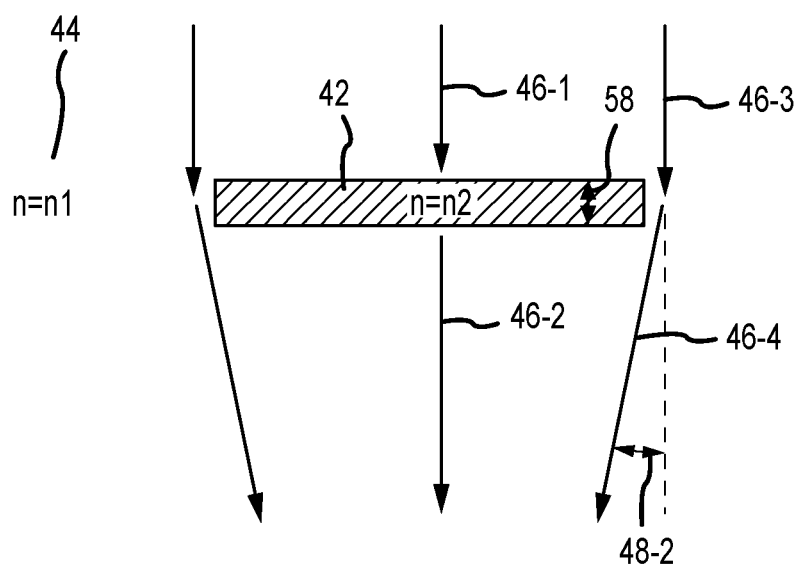

In addition to the refractive indexes of the diffractive lens and the surrounding material, the thickness of the diffractive lens may also affect the response of incident light to the diffractive lens. FIGS. 4A and 4B show illustrative diffractive lenses used to focus incident light (as in FIG. 3A, for example). As shown in FIG. 4A, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4A, the index of refraction of the lens may be greater than the index of refraction of the surrounding material (i.e., n2>n1). This results in the light being focused to a focal point.

In particular, incident light 46-3 may pass by the edge of diffractive lens 42. The light may be redirected such that the output light 46-4 travels at an angle 48-1 relative to the incident light 46-3. This angle may be dependent upon the thickness 56 of diffractive lens 42. In the example of FIG. 4A, thickness 56 is associated with an angle of diffraction of 48-1. Diffractive lens 42 in FIG. 4A may have a relatively large thickness and, accordingly, a relatively large angle of diffraction 48-1.

In contrast, diffractive lens 42 in FIG. 4B may have a relatively small thickness and a relatively small angle of diffraction 48-2. As shown in FIG. 4B, a diffractive lens 42 may be formed in a surrounding medium 44. The surrounding material 44 may be formed from a first material that has a first index of refraction (n1). Diffractive lens 42 may be formed from a second material that has a second index of refraction (n2). In the example of FIG. 4B, the index of refraction of the lens may be greater than the index of refraction of the surrounding material (i.e., n2>n1). This results in the light being focused to a focal point. In particular, the light at the edge of the diffractive lens may be redirected such that the output light 46-4 travels at an angle 48-2 relative to the incident light 46-3. This angle may be dependent upon the thickness 58 of diffractive lens 42. Because thickness 58 in FIG. 4B is less than thickness 56 in FIG. 4A, angle 48-2 in FIG. 4B is less than angle 48-1 in FIG. 4A.

Diffractive lenses 42 in FIGS. 4A and 4B have the same length and width. However, the length and width of diffractive lenses may also be adjusted to alter the response of incident light 46.

This shows how diffractive lenses may be used to redirect incident light in desired ways. The refractive indexes of the lens and surrounding material may be altered to customize the response of incident light. Additionally, the thickness, length, and width, of the diffractive lens may be altered to customize the response of incident light.

Figure 5:
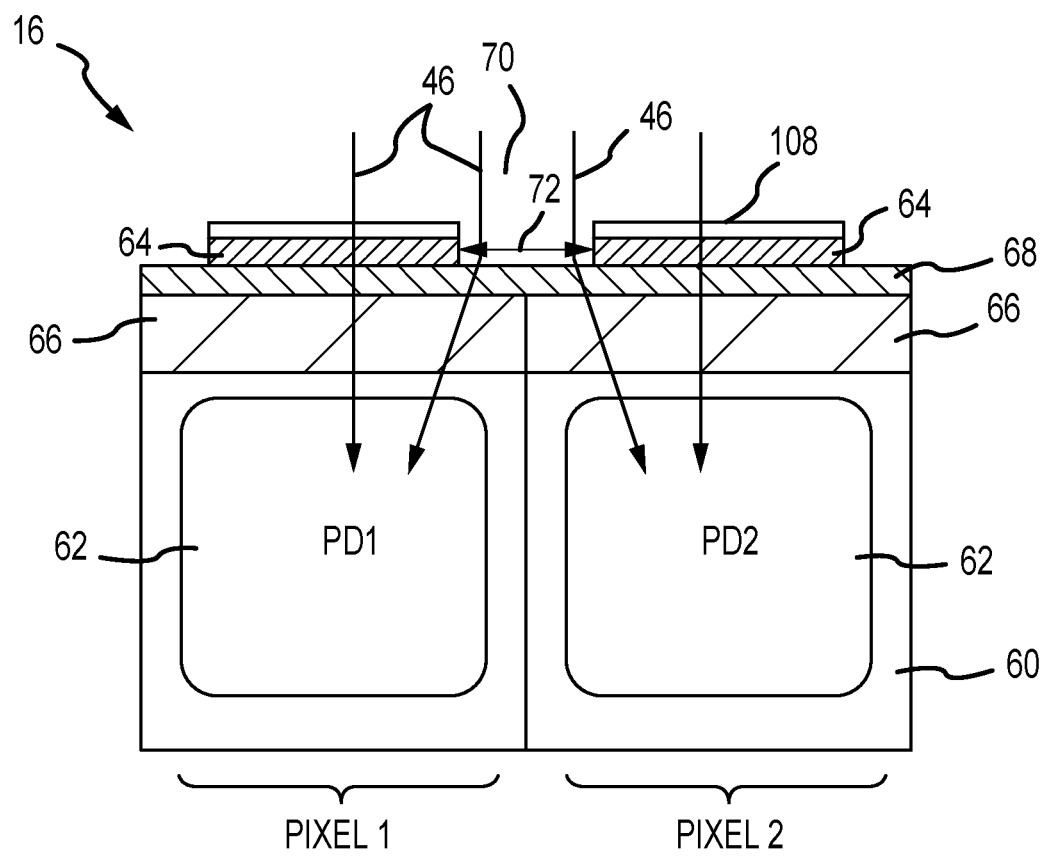
FIG. 5 is a cross-sectional side view of an illustrative image sensor with diffractive lenses formed over the photosensitive area of each pixel on a planarization layer in accordance with an embodiment.

FIG. 5 is a cross-sectional side view of an illustrative image sensor with diffractive lenses. Image sensor 16 may include first and second pixels such as Pixel 1 and Pixel 2. Pixel 1 and Pixel 2 may include photosensitive regions 62 formed in a substrate such as silicon substrate 60. For example, Pixel 1 may include an associated photosensitive region such as photodiode PD1, and Pixel 2 may include an associated photosensitive region such as photodiode PD2. Diffractive lenses 64 may be formed over photodiodes PD1 and PD2 and may be used to direct incident light towards photodiodes PD1 and PD2. An additional anti-reflective coating 108 (sometimes referred to as a diffractive lens anti-reflective coating) may be formed on one or more surfaces of diffractive lenses 64. The additional anti-reflective coating 108 may optionally be applied to any of the diffractive lenses of FIGS. 3-11.

Color filters such as color filter elements 66 may be interposed between diffractive lenses 64 and substrate 60. Color filter elements 66 may filter incident light by only allowing predetermined wavelengths to pass through color filter elements 66 (e.g., color filter 66 may only be transparent to the certain ranges of wavelengths). Color filter elements 66 may be part of a color filter array formed on the back surface of substrate 60. A respective diffractive lens 64 may cover each color filter element 66 in the color filter array. Light can enter from the back side of the image pixels through diffractive lenses 64. While in FIG. 5 image sensor 16 is a back-side illuminated image sensor, image sensor 16 may instead be a front-side illuminated image sensor if desired. Photodiodes PD1 and PD2 may serve to absorb incident light focused by diffractive lenses 64 and produce pixel signals that correspond to the amount of incident light absorbed.

Color filters 66 may include green filters, red filters, blue filters, yellow filters, cyan filters, magenta filters, clear filters, infrared filters, or other types of filters. As an example, a green filter passes green light (e.g., light with wavelengths from 495 nm to 570 nm) and reflects and/or absorbs light out of that range (e.g., the green filter reflects red light and blue light). An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

A layer (sometimes referred to as a planarization layer, passivation layer, dielectric layer, film, planar film, or planarization film) may be interposed between color filter elements 66 and diffractive lenses 64. Planarization layer 68 may be formed across the entire array of imaging pixels in image sensor 16. Cladding 70 may cover diffractive lenses 64 on the other side of planarization layer 68. In other words, diffractive lenses 64 may have first and second opposing sides with planarization layer 68 formed on the first side and cladding 70 formed on the second side.

Diffractive lenses 64 may be formed from any desired material. It may be desirable for diffractive lenses 64 to be transparent and formed from a material with a higher refractive index than the surrounding materials. Diffractive lenses 64 may sometimes be formed from silicon nitride (with a refractive index of approximately 1.9). In general, diffractive lenses 64 may have any desired index of refraction (e.g., between 1.8 and 2.0, between 1.6 and 2.2, between 1.5 and 2.5, between 1.5 and 2.0, more than 1.3, more than 1.6, more than 1.8, more than 2.0, less than 2.0, less than 1.8, etc.). Planarization layer 68 may also be transparent and formed from a material with any desired refractive index (e.g., a lower refractive index than diffractive lenses 64). Planar layer 68 may be formed from a material with a refractive index between 1.3 and 1.5, between 1.2 and 1.8, greater than 1.3, or any other desired refractive index. Cladding 70 may be formed from any desired material (i.e., air, the same material as planar film 68, etc.). Cladding 70 may also have a different (e.g., lower) refractive index than diffractive lenses 64.

Diffractive lenses 64 may have a higher index of refraction than the surrounding materials (cladding 70 and planar film 68). Accordingly, light passing by the edge of diffractive lenses may be focused towards the photodiodes of the pixels. FIG. 5 shows incident light 46 being focused towards photosensitive areas PD1 and PD2 by diffractive lenses 64. Focusing incident light in this way may reduce optical cross-talk between pixels.

As previously discussed, the refractive indexes of the diffractive lenses and surrounding materials, as well as the dimensions of the diffractive lenses, may be altered to customize the response to incident light. Additionally, the distance 72 between each diffractive lens may be altered to change the response of incident light.

In some embodiments, the diffractive lens over each pixel in the pixel array may be the same. However, in other embodiments different pixels may have unique diffractive lenses to further customize the response to incident light.

Figure 6:
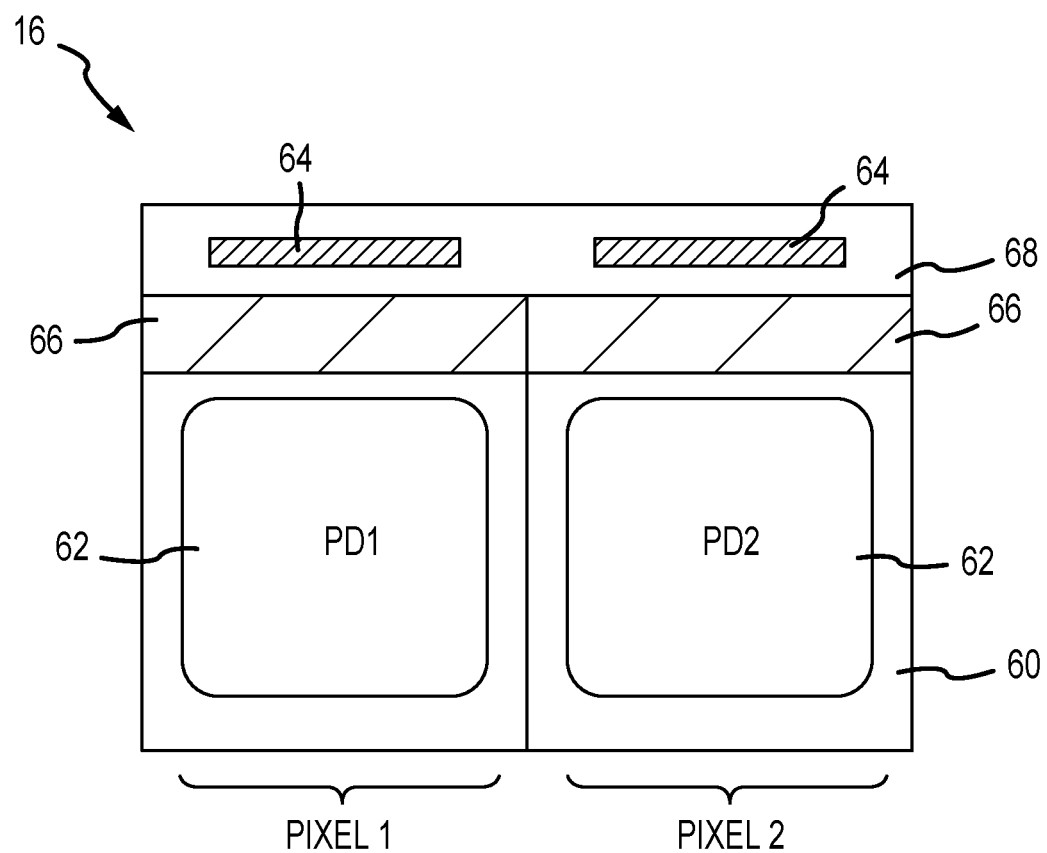
FIG. 6 is a cross-sectional side view of an illustrative image sensor with diffractive lenses formed over the photosensitive area of each pixel within a planarization layer in accordance with an embodiment.

In FIG. 5, diffractive lenses 64 are formed on planar film 68, with a cladding 70 formed over the diffractive lenses. In this embodiment, diffractive lenses 64 are mounted on the top surface of planarization layer 68. This example is merely illustrative, and other arrangements may be used if desired. For example, FIG. 6 shows an illustrative image sensor 16 with diffractive lenses 64 embedded within layer 68. As shown, diffractive lenses 64 may be surrounded on all sides by planarization layer 68. Planarization layer 68 may still have a lower refractive index than diffractive lenses 64 to ensure incident light is focused onto the photosensitive areas. Diffractive lenses 64 may be embedded within layer 68 using deposition and etching or Lift-off steps. For example, a first planar portion of layer 68 may be deposited. Next, the material of diffractive lenses 64 may be deposited and etched (or removed using Lift-off steps) to form diffractive lenses of the desired shape. Finally, an additional portion of layer 68 may be deposited to fill the space between diffractive lenses and cover the diffractive lenses such that layer 68 has a planar top surface.

Figure 7A:
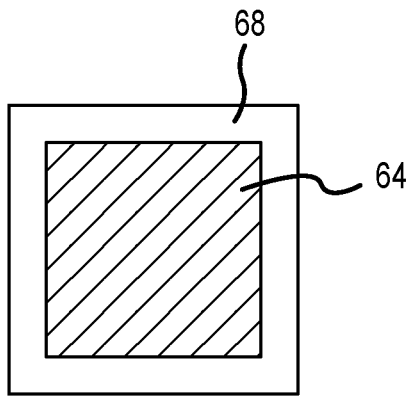
FIGS. 7A-7E are top views of illustrative diffractive lenses showing different shapes for the diffractive lenses in accordance with an embodiment.
Figure 7B:
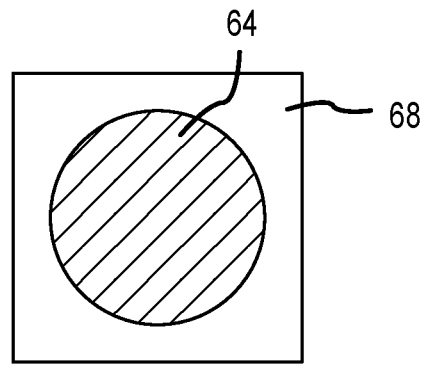
Figure 7C:
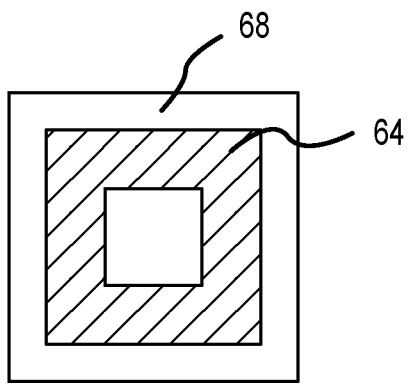
Figure 7D:
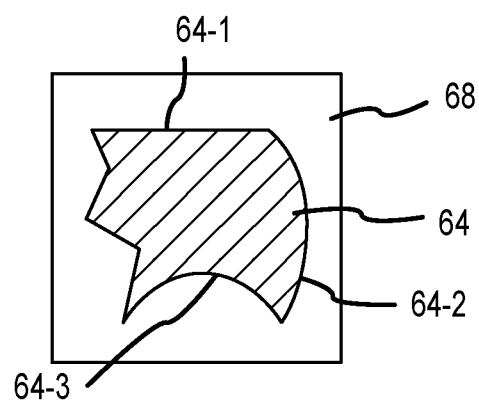
Figure 7E:
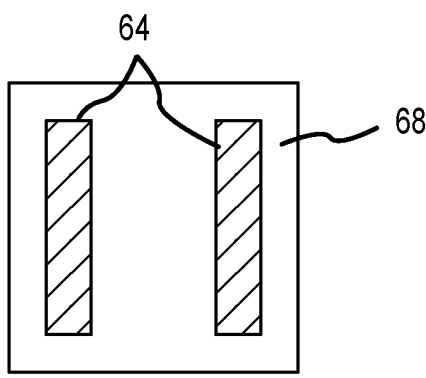

As previously mentioned, each diffractive lens 64 may have any desired shape. FIGS. 7A-7E are top views of illustrative diffractive lenses with different shapes. As shown in FIG. 7A, diffractive lens 64 may have a rectangular (or square) shape. As shown in FIG. 7B, diffractive lens 64 may be formed from a shape with curved edges such as a circle or oval. In the embodiments of FIGS. 7A and 7B, diffractive lens 64 does not have any openings. However, these examples are merely illustrative. As shown in FIG. 7C, diffractive lens 64 may have one or more openings such that the lens is ring-shaped. As shown in FIG. 7D, the diffractive lens does not have to be a regular shape. FIG. 7D shows an irregularly shaped diffractive lens. The diffractive lens may include one or more planar sides (i.e., 64-1), one or more curved sides that curve outward (i.e., 64-2), and/or one or more curved sides that curve inward (i.e., 64-3). Finally, as shown in FIG. 7E, the diffractive lens may be split into more than one section. The diffractive lens may have two or more separately formed vertical sections or two or more separately formed horizontal sections.

Figure 8:
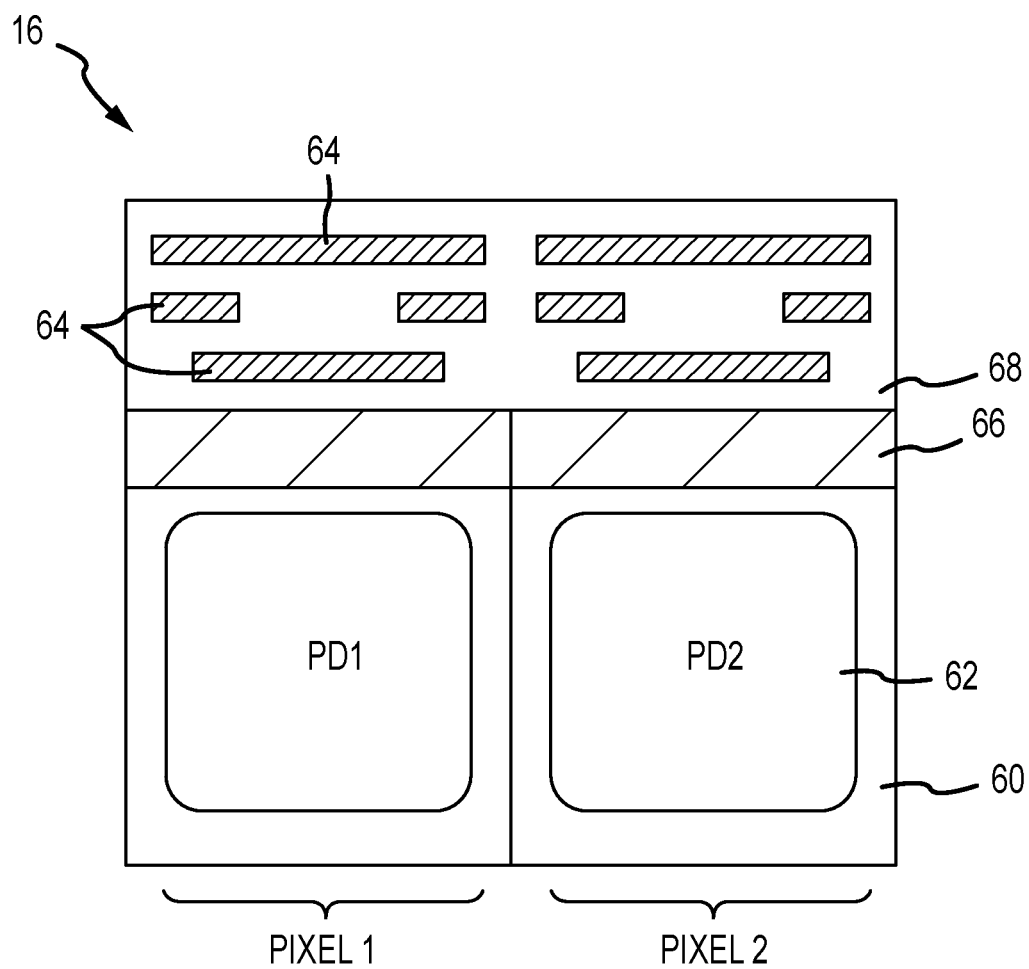
FIG. 8 is a cross-sectional side view of an illustrative image sensor with more than one diffractive lens formed over the photosensitive area of each pixel in accordance with an embodiment.

In the embodiments of FIGS. 5 and 6, one diffractive lens is formed over each pixel. These examples are merely illustrative. If desired, more than one diffractive lens may be formed over each image pixel. FIG. 8 shows an illustrative image sensor 16 with multiple diffractive lenses over each pixel. In some embodiments, each diffractive lens may have a refractive index greater than the refractive index of the surrounding layer 68 (i.e., each diffractive lens may be a focusing lens). In other embodiments, each diffractive lens may have a refractive index lower than the refractive index of the surrounding layer 68 (i.e., each diffractive lens may be a defocusing lens). In yet other embodiments, one or more diffractive lenses may have a refractive index lower than the refractive index of the surrounding layer 68 whereas one or more diffractive lenses may have a refractive index greater than the refractive index of the surrounding layer (i.e., there may be one or more defocusing lenses and one or more focusing lenses).

FIGS. 5 and 6 show illustrative arrangements for a diffractive lens. In FIG. 5, diffractive lenses 64 are mounted on the top surface of planarization layer 68 (and diffractive lenses 64 may have a higher index of refraction than planarization layer 68) and in FIG. 6 diffractive lenses 64 are embedded within planarization layer 68 (and diffractive lenses 64 may have a higher index of refraction than planarization layer 68). However, other arrangements may be used for diffractive lenses 64 and the surrounding layers if desired.

Figure 9:
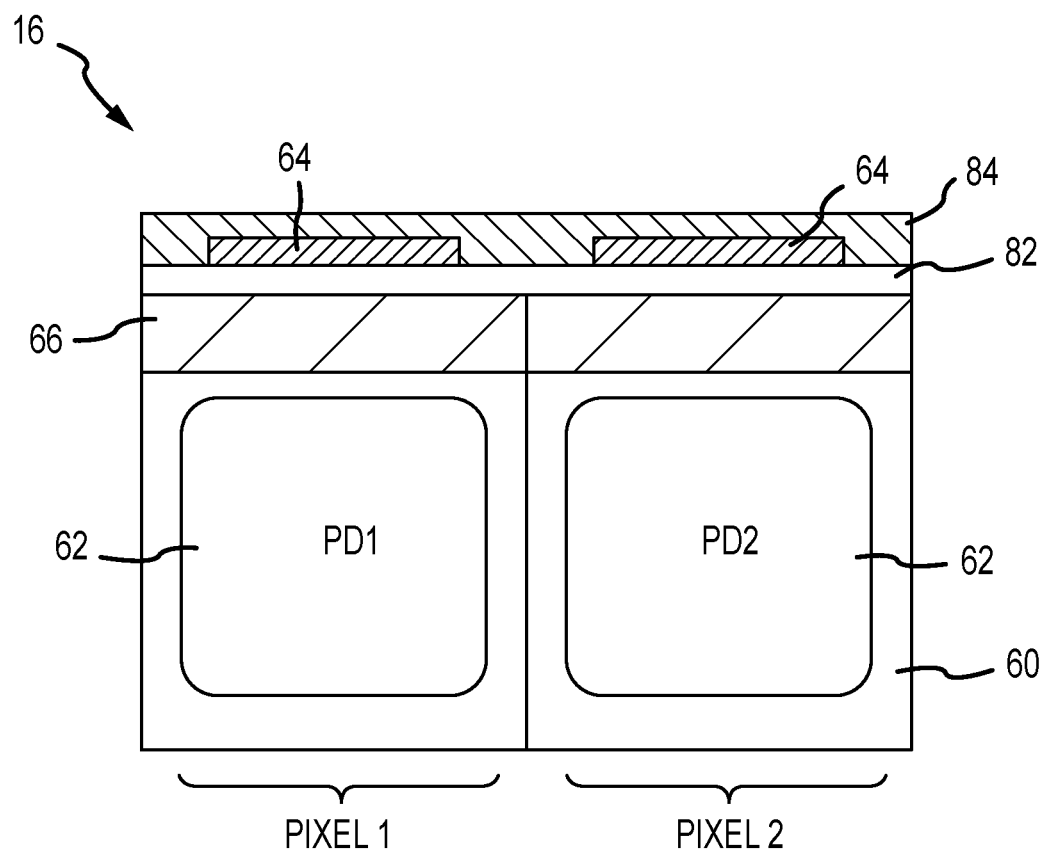
FIG. 9 is a cross-sectional side view of an illustrative image sensor with diffractive lenses, a first layer having any refractive index formed below the diffractive lenses, and a second layer having a refractive index that is lower than the refractive index of the diffractive lenses formed above and to the sides of the diffractive lenses in accordance with an embodiment.
Figure 10:
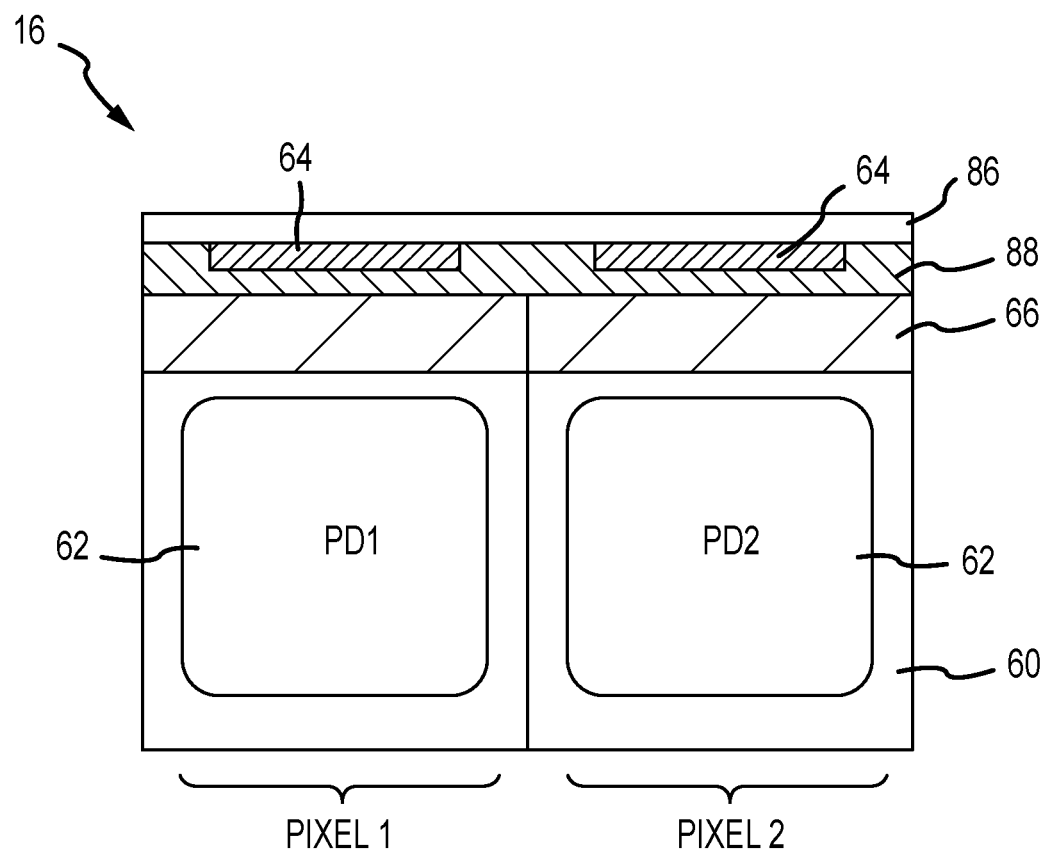
FIG. 10 is a cross-sectional side view of an illustrative image sensor with diffractive lenses, a first layer having any refractive index formed above the diffractive lenses, and a second layer having a refractive index that is lower than the refractive index of the diffractive lenses formed below and to the sides of the diffractive lenses in accordance with an embodiment.
Figure 11:
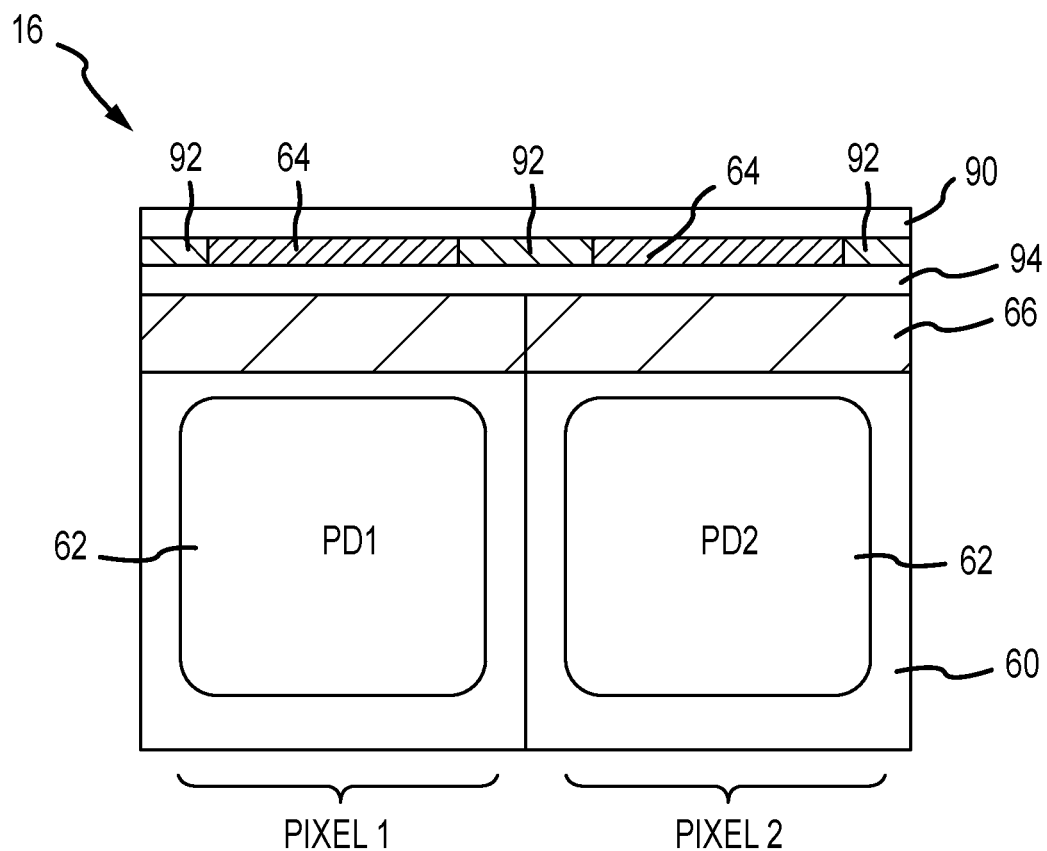
FIG. 11 is a cross-sectional side view of an illustrative image sensor with diffractive lenses, a first layer having any refractive index formed above the diffractive lenses, a second layer having a refractive index that is lower than the refractive index of the diffractive lenses formed to the sides of the diffractive lenses, and a third layer having any refractive index formed below the diffractive lenses in accordance with an embodiment.

FIGS. 9-11 are cross-sectional side views showing possible arrangements for layers adjacent to diffractive lenses 64 in image sensor 16. As shown in FIG. 9, a first layer 82 may be formed underneath (below) diffractive lenses 64. Layer 82 may have any desired refractive index (e.g., greater than, less than, or equal to the index of refraction of diffractive lenses 64). A second layer 84 may be formed above (over) and to the sides of diffractive lenses 84 (e.g., a first portion of layer 84 is formed above the upper surfaces of diffractive lenses 64 and a second portion of layer 84 is interposed between the side surfaces of adjacent diffractive lenses 64). Layer 84 may have a refractive index that is less than the refractive index of diffractive lenses 64. Layers 82 and 84 may be transparent and may be formed from any desired materials. Layers 82 and 84 may be formed from the same materials or different materials. Layers 82 and 84 may sometimes be referred to as planarization layers, dielectric layers, or cladding layers.

As shown in FIG. 10, a first layer 86 may be formed over diffractive lenses 64. Layer 86 may have any desired index of refraction (e.g., greater than, less than, or equal to the index of refraction of diffractive lenses 64). A second layer 88 may be formed under and to the sides of diffractive lenses 64 (e.g., a first portion of layer 88 is formed below the lower surfaces of diffractive lenses 64 and a second portion of layer 84 is interposed between the side surfaces of adjacent diffractive lenses 64). Layer 88 may have a refractive index that is less than the refractive index of diffractive lenses 64. Layers 86 and 88 may be transparent and may be formed from any desired materials. Layers 86 and 88 may be formed from the same materials or different materials. Layers 86 and 88 may sometimes be referred to as planarization layers, dielectric layers, or cladding layers.

In yet another arrangement shown in FIG. 11, a first layer 90 may be formed over diffractive lenses 64. Layer 90 may have any desired index of refraction (e.g., greater than, less than, or equal to the index of refraction of diffractive lenses 64). A second layer 92 may be formed between diffractive lenses 64 (e.g., layer 92 may be interposed between the side surfaces of adjacent diffractive lenses 64). Layer 92 may have an index of refraction that is less than the index of refraction of diffractive lenses 64. A third layer 94 may be formed under diffractive lenses 64. Layer 94 may have any desired index of refraction (e.g., greater than, less than, or equal to the index of refraction of diffractive lenses 64). Layers 90, 92, and 94 may be transparent and may be formed from any desired materials. Layers 90, 92, and 94 may be formed from the same materials or different materials. Layers 90, 92, and 94 may sometimes be referred to as planarization layers, dielectric layers, or cladding layers.

In the embodiments of FIGS. 5, 6, 7A-7E, and 8-11, at least one diffractive lens is formed over each pixel. These diffractive lenses may take the place of any other per-pixel lenses. For example, no microlenses may be present over each pixel that have curved upper surfaces. No microlenses may be present over each pixel that use refraction to focus light.

In various embodiments, an image sensor may have a plurality of imaging pixels that each includes a photodiode, a color filter element formed over the photodiode, and a diffractive lens formed over the color filter element. The diffractive lens of each imaging pixel may have a planar upper surface and a planar lower surface. No microlens with a curved surface may be formed over the diffractive lens of each pixel. The diffractive lens may include silicon nitride. The image sensor may also include a planarization layer that is formed over the plurality of imaging pixels. Each diffractive lens may be formed on an upper surface of the planarization layer. Each diffractive lens may be embedded within the planarization layer. The planarization layer may have a first index of refraction, the diffractive lens for each imaging pixel may have a second index of refraction, and the second index of refraction may be greater than the first index of refraction. There may be a gap between each diffractive lens and respective adjacent diffractive lenses.

In various embodiments, an imaging pixel may include a photosensitive area, a color filter element formed over the photosensitive area, a planarization layer formed over the color filter element, and a diffractive lens formed over the color filter element. The diffractive lens may be transparent, the diffractive lens may have first and second opposing surfaces, the first and second surfaces of the diffractive lens may be planar, the diffractive lens may have a first index of refraction, and the planarization layer may have a second index of refraction that is lower than the first index of refraction.

The planarization layer may have first and second opposing surfaces and the first and second surfaces of the planarization layer may be parallel to the first and second surfaces of the diffractive lens. The diffractive lens may be formed on an upper (or lower) surface of the planarization layer. The diffractive lens may be embedded within the planarization layer. Light incident on a central portion of the imaging pixel may pass through the diffractive lens without being redirected and light incident on an edge portion of the imaging pixel may be redirected by the diffractive lens towards the photosensitive area. The imaging pixel may also include an additional diffractive lens formed over (or under) the diffractive lens. The additional diffractive lens may have a third index of refraction. The second index of refraction may be greater than the third index of refraction. The second index of refraction may be less than the third index of refraction.

In various embodiments, an image sensor may include a plurality of imaging pixels that each includes a photosensitive area and a planar diffractive lens formed over the photosensitive area that focuses incident light onto the photosensitive area. The planar diffractive lens of each imaging pixel may be surrounded by at least one layer and the planar diffractive lens of each imaging pixel may have a greater index of refraction than the at least one layer. The planar diffractive lens may include silicon nitride.

The foregoing is merely illustrative of the principles of this invention and various modifications can be made by those skilled in the art without departing from the scope and spirit of the invention.

What is claimed is:

1. An image sensor comprising a plurality of imaging pixels, wherein an imaging pixel of the plurality of imaging pixels comprises:

a photodiode; and
a diffractive lens formed over the photodiode, wherein the diffractive lens of the imaging pixel is formed from a first material that has a first index of refraction, wherein there is a gap between the diffractive lens and a respective adjacent diffractive lens of an adjacent imaging pixel, and wherein a layer that is formed from a second material having a second index of refraction that is different than the first index of refraction fills the gap and extends continuously between the diffractive lens and the respective adjacent diffractive lens.

2. The image sensor defined in claim 1, wherein the diffractive lens has a planar upper surface and a planar lower surface.

3. The image sensor defined in claim 2, wherein no microlens with a curved surface is formed over the diffractive lens.

4. The image sensor defined in claim 1, wherein the diffractive lens comprises silicon nitride.

5. The image sensor defined in claim 1, further comprising:

a planarization layer that is formed over the plurality of imaging pixels.

6. The image sensor defined in claim 5, wherein the diffractive lens is formed on a surface of the planarization layer.

7. The image sensor defined in claim 6, wherein the layer that is formed from the second material is formed on the surface of the planarization layer.

8. The image sensor defined in claim 1, wherein the layer that is formed from the second material comprises a planarization layer and wherein the diffractive lens is embedded within the planarization layer.

9. An imaging pixel comprising:

a photosensitive area;
a first diffractive lens formed over the photosensitive area, wherein the first diffractive lens is transparent, wherein the first diffractive lens has first and second opposing surfaces, wherein the first and second surfaces of the first diffractive lens are planar, and wherein the diffractive lens has a first index of refraction;
a layer of material formed over the first diffractive lens that has a second index of refraction that is different than the first index of refraction; and
a second diffractive lens formed over the first diffractive lens, wherein a portion of the layer of material is interposed between the first diffractive lens and the second diffractive lens.

10. The imaging pixel defined in claim 9, wherein the first diffractive lens is embedded within the layer of material.

11. The imaging pixel defined in claim 10, wherein the second diffractive lens is embedded within the layer of material.

12. The imaging pixel defined in claim 9, wherein the second diffractive lens has a third index of refraction that is different than the first and second indices of refraction.

13. The imaging pixel defined in claim 12, wherein the third index of refraction is greater than the first index of refraction.

14. The imaging pixel defined in claim 12, wherein the third index of refraction is less than the first index of refraction.

15. The imaging pixel defined in claim 9, further comprising:

a color filter element formed over the photosensitive area.

16. An image sensor comprising a plurality of imaging pixels, wherein each imaging pixel of the plurality of imaging pixels comprises:
   a photosensitive area;
   a diffractive lens formed over the photosensitive area, wherein the diffractive lens has an upper surface, a lower surface, and edge surfaces and wherein the diffractive lens has a first index of refraction; and
   a layer of material having a second index of refraction that is different than the first index of refraction, wherein the edge surfaces, the upper surface, and the lower surface of the diffractive lens are in direct contact with the layer of material.

17. The image sensor defined in claim 16, wherein the diffractive lens comprises silicon nitride.

18. The imaging pixel defined in claim 9, wherein the second index of refraction is different than an additional index of refraction of the second diffractive lens.

19. The imaging pixel defined in claim 9, wherein the layer of material is formed from a different material than the second diffractive lens.

\* \* \* \* \*